United States Patent [19]

Jun

[11] Patent Number: 5,449,635
[45] Date of Patent: Sep. 12, 1995

[54] METHOD OF FABRICATING A SEMICONDUCTOR MEMORY

[75] Inventor: Young K. Jun, Seoul, Rep. of Korea

[73] Assignee: Goldstar Electron Co., Ltd., Rep. of Korea

[21] Appl. No.: 174,228

[22] Filed: Dec. 28, 1993

[51] Int. Cl.6 .................................... H01L 21/8242
[52] U.S. Cl. ................................ 437/52; 437/47; 437/60; 437/919
[58] Field of Search ................ 437/47, 48, 52, 60, 437/919; 257/306, 307, 308

[56] References Cited

U.S. PATENT DOCUMENTS

| | | | |
|---|---|---|---|
| 5,049,957 | 9/1991 | Inoue et al. | 437/52 |
| 5,068,698 | 11/1991 | Koyama | 437/52 |
| 5,071,781 | 12/1991 | Seo et al. | 437/52 |
| 5,102,820 | 4/1992 | Chiba | 437/52 |
| 5,164,337 | 11/1992 | Ogawa et al. | 437/52 |
| 5,219,780 | 6/1993 | Jun | 437/52 |
| 5,314,835 | 2/1994 | Iguchi et al. | 437/52 |

*Primary Examiner*—Tom Thomas
*Attorney, Agent, or Firm*—Poms, Smith, Lande & Rose

[57] ABSTRACT

A method for fabricating a semiconductor memory, including the steps of: forming transistors on a semiconductor substrate (100); forming a first insulation film (23, 24, 25) on the semiconductor substrate; forming contact holes by selectively etching the first insulation film; forming successively a first conductive layer (26), an etch preventing film (27), and a first temporary film (28) on the substrate and the contact holes; etching the first temporary film and the etch preventing film to selectively expose the first conduction layer; forming a second temporary film (30) on the first temporary film and the first conductive layer; etching the second temporary film to form sidewall spacers of the second temporary film at sidewalls of the first temporary film; patterning the first conduction film using the first temporary film and the sidewall spacers as masks; forming a second insulation film (31) on the first conductive layer, the sidewall spacers and the first temporary film; etching the second insulation film selectively removing the temporary film and the sidewall spacers; forming a second conductive film (34) on the second insulation film, the first conductive layer and the etch preventing film; etching the second conductive layer to form a capacitor storage node (35) composed of the first conduction layer and the second conduction layer by removing the second insulation film.

17 Claims, 9 Drawing Sheets

METHOD OF FABRICATING A SEMICONDUCTOR MEMORY

FIELD OF THE INVENTION

This invention relates to a semiconductor memory having a stacked capacitor and a method of fabricating the same.

BACKGROUND OF THE INVENTION

Keeping pace with the development of semiconductors, efforts to integrate more elements onto one semiconductor chip in high degree have been actively progressing. Particularly, in DRAM(Dynamic Random Access Memory) cell, various cell structures have been proposed to minimize the size of a element.

For high integration, it is preferable that a memory cell is composed of one transistor and one capacitor in a view to minimize the occupied area on a chip.

In a memory cell composed of one transistor and one capacitor as mentioned before, a signal charge is stored in a storage node of a capacitor which is connected to a transistor (switching transistor). Consequently, if the size of a memory cell is decreased for high integration of a semiconductor, because the size of the capacitor has to be decreased accordingly, the number of charges which can be stored in a storage node have to also decrease.

Therefore, in order to transmit a desired signal without any malfunction, the capacitor storage node of a memory cell has to have a surface area greater than a certain predetermined value to secure a capacitor capacity required for the transmission of a signal.

Thus, a capacitor storage node has to have a relatively large area within the limited area of a semiconductor substrate to decrease the size of a memory cell.

Of the various memory cell constructions proposed to increase the surface area of a capacitor storage node, a stack capacitor is a capacitor structure having the advantages of being favorable for high integration while being influenced by soft error little.

Further, a memory cell having stacked capacitor also has the advantages of being suitable for mass production with a relatively simple process.

Referring to FIGS. 1(a) to 1(g), one of stacked capacitor disclosed by H. Ogawa et al. (U.S. Pat No. 5,164,337) to increase capacitor capacity is explained hereinafter.

At first, as shown in FIG. 1(a), form a switching transistor 50 having N-impurity regions 19 functioning as a source and a drain, and gate poles 2, on a P-silicon substrate, then form a multi-layer insulation film of first oxide film 3, nitride film 4 and second oxide film 5 being coated successively on all over the surface of the formed switching transistor 50.

Next, as shown in FIG. 1(b), after forming contact hole 18 with a photo etching process for connecting the switching transistor with the capacitor storage node formed in the successive process, form first conduction layer 6 on all over the surface of the second oxide film 5 including the contact holes 18.

Thereafter, as shown in FIG. 1(c), form a multi-layer film 80 by depositions of more than two layers of insulation film (a first NSG (Nondoped Silicate Glass) film 7, PSG (Phospho-Silicate Glass) film 8 and a second NSG film 9) having different wet etching property alternatively. Then form a desired pattern by first etching of the multi-layer film 80 with anisotropic etching in the first time.

Next, as shown in FIG. 1(d), etch the patterned multi-layer film 80 in NH4:HF=20:1 solution for two minutes with isotropic etching in the second time so as to form indented part thereon according to the difference of degree of etching of the multi-layer film 80.

Then, after forming a second conduction layer 10 on all over the surface of above resultant as shown in FIG. 1(e), etch back with anisotropic etching so as to leave the second conduction layer 10 only on the side of the multi-layer film 7, 8 and 9, and the first conduction layer 6 exposed thereafter as shown in FIG. 1(f).

And, by removing the multi-layer film 7, 8 and 9, and the second oxide film. 5 under the first conduction layer 6 with wet etching, a capacitor storage node 1 composed of first conduction layer 6 and the second conduction layer 10 can be completed.

Thereafter, by forming dielectric film and plate pole (not shown) using general capacitor forming process, a box shape semiconductor memory cell capacitor can be completed.

In the prior art technology described above, the indented parts are formed with wet etching, in the multi-layer film utilizing the difference of etching speed of the multi-layer film which has a problem that a precise control of the amount of etching is difficult on wet etching, and because the more the storage node is stacked, the weaker the mechanical strength of the column formed of the first conduction layer in the contact hole 18 to connect the switching transistor with the capacitor storage node becomes, the problem of low reliability arises.

SUMMARY OF THE INVENTION

The object of this invention, being to solve foregoing problems, is to increase a capacitor capacity of a stacked semiconductor memory as well as to improve the reliability of the process.

This and other objects and the features of this invention can be achieved by providing a semiconductor memory comprising a semiconductor substrate; transistors having gate poles and, source and drain area formed on the semiconductor substrate; an insulation film formed on all over the surface of the transistor having contact hole with round upper part exposing the source and drain area of the transistor; and a capacitor storage node having a first conduction layer formed inside and along the round part of the contact hole on the insulation film and extended up to a certain desired height and a second conduction layer formed over the first conduction layer which is, in turn, formed over the insulation layer having curved internal portion and curved inside, and a method for fabricating a semiconductor memory comprising steps for forming transistors on a semiconductor substrate, forming an insulation film on all over the surface of the semiconductor substrate on which the transistors have been formed, forming contact holes having round upper part by etching the insulation film selectively, forming a first conduction layer, an etch preventing film and a temporary film on all over the surface of the resultant successively, carrying out etching of the temporary film and the etch preventing film selectively to expose the first conduction layer, forming side walls of the temporary film at the side of the temporary film by forming an insulation film on all over the surface of the resultant and etching back thereafter, patterning the first conduction film using the temporary film and the side walls of the temporary film as masks, etching the insulation film selectively, removing the temporary film and the side walls of the temporary film, forming second conduction film on all over the surface of the resultant, etching back the second conduction layer, and forming a capacitor storage node composed of the first conduction layer and the second conduction layer by removing the insulation film.

DETAILED DESCRIPTION OF THE INVENTION

The details of the preferred embodiments of this invention are to be explained hereinafter referring to the accompanying drawings.

Figure 3:
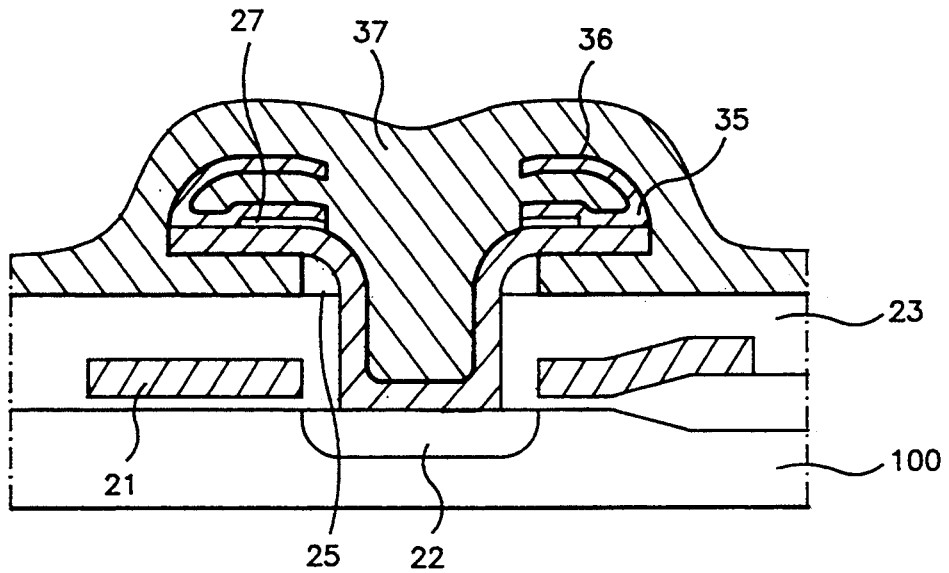
FIG. 3 is a sectional view of a capacitor formed by a forming method of a capacitor of a memory in accordance with the first embodiment of this invention.

FIG. 3 is a sectional view of a capacitor formed by a forming method of a capacitor of a semiconductor memory in accordance with a first embodiment of this invention.

A capacitor of a semiconductor memory in accordance with this invention has, as shown in FIG. 3, a switching transistor having gate pole 21 and source and drain area 22, formed in an active region of a semiconductor substrate 100 divided into an active region and field region, and on all over the surface of the switching transistor, an oxide film as a first insulation film is formed. On this oxide film 23, a contact hole for connecting the switching transistor with a capacitor to be formed in successive process, is formed in source and drain area 22.

Through the contact hole, the capacitor storage node is connected with the source (or drain) area 22 of the switching transistor, which capacitor storage node has stacks of a first conduction layer 26 and a second conduction layer 34.

The first conduction layer 26 of the stacked storage node is formed along the inner surface of the contact hole, forming round in the upper part of the contact hole, and extending above the first insulation film 23.

And the second conduction layer 34 of the stacked storage node is formed on the first conduction film 26 which is formed over the first insulation film 23 having inside bend.

On all over the surface of the stacked storage node connected as described above, a capacitor dielectric film 36 is formed, and on all over the surface of the dielectric film, a capacitor plate pole 37 is formed.

As described above, a semiconductor memory capacitor in accordance with this invention can provide a storage node having stack of upper and lower conduction film, can improve coating property of the lower conduction film formed along the round part in the upper part of the contact hole which has been provided to connect the switching transistor with the capacitor, by utilizing the round part, and can have an increased surface area of the storage node which permits a large capacity capacitor.

Next, a method for production of capacitor of a semiconductor memory according to the first embodiment of this invention is to be described hereinafter, referring to FIGS. 2(a) to 2(k).

Figure 1A:
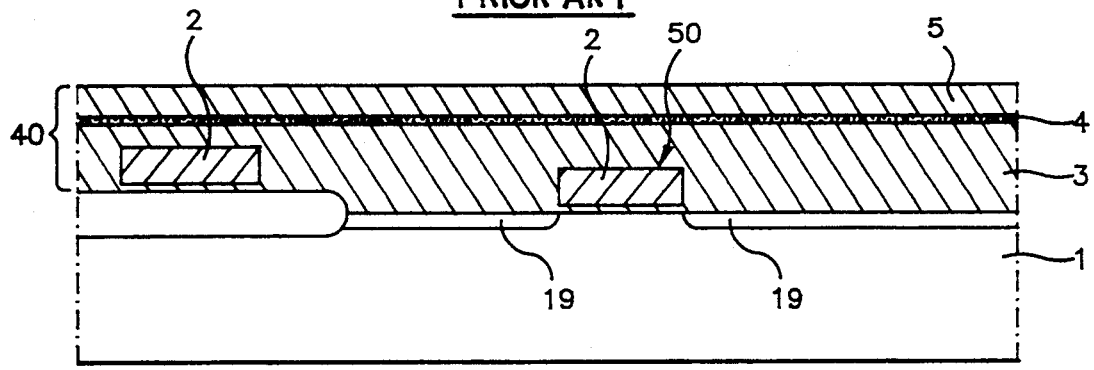
FIGS. 1(a) to 1(g) are conventional processes showing a forming method of a capacitor of a semiconductor memory.
Figure 1B:
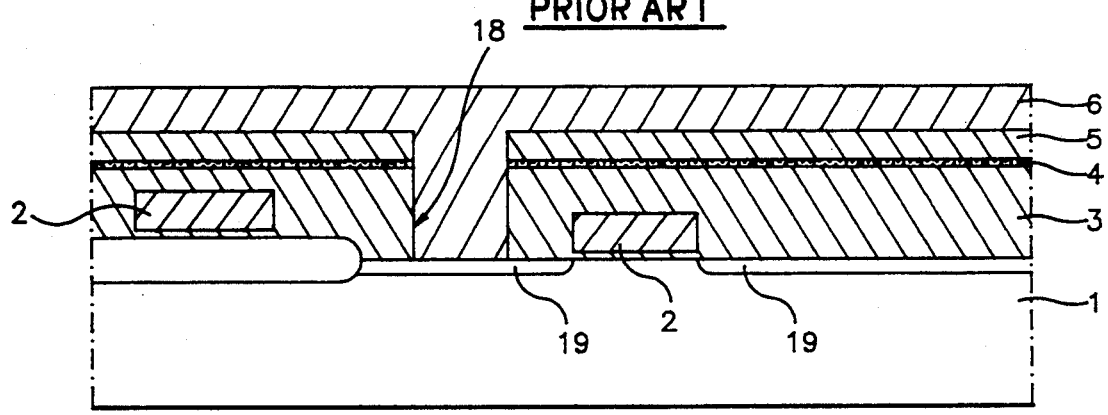
Figure 1C:
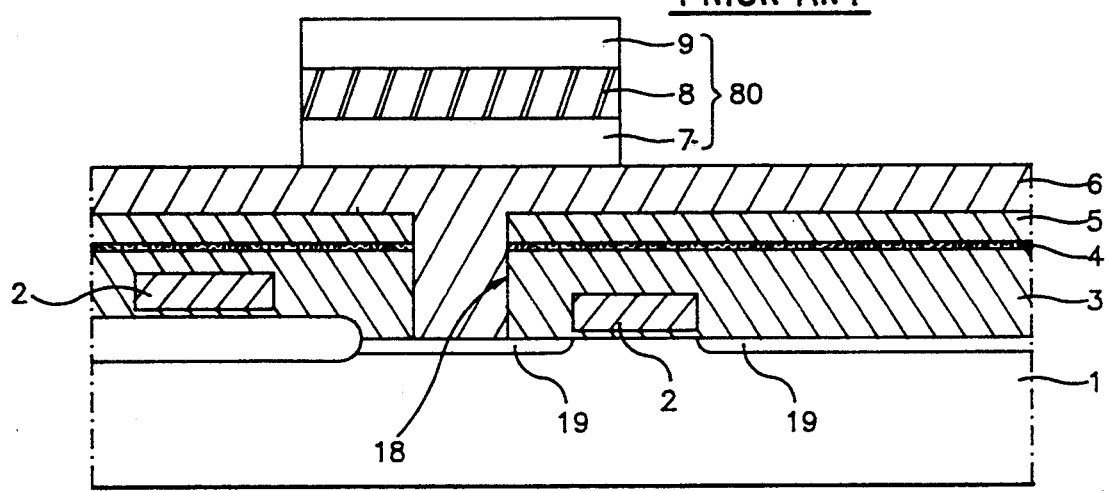
Figure 1D:
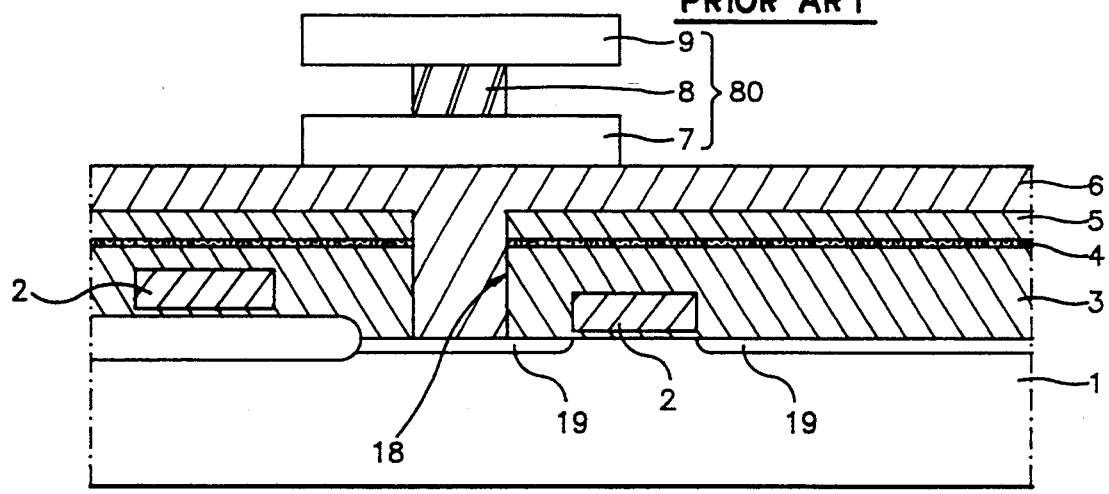
Figure 1E:
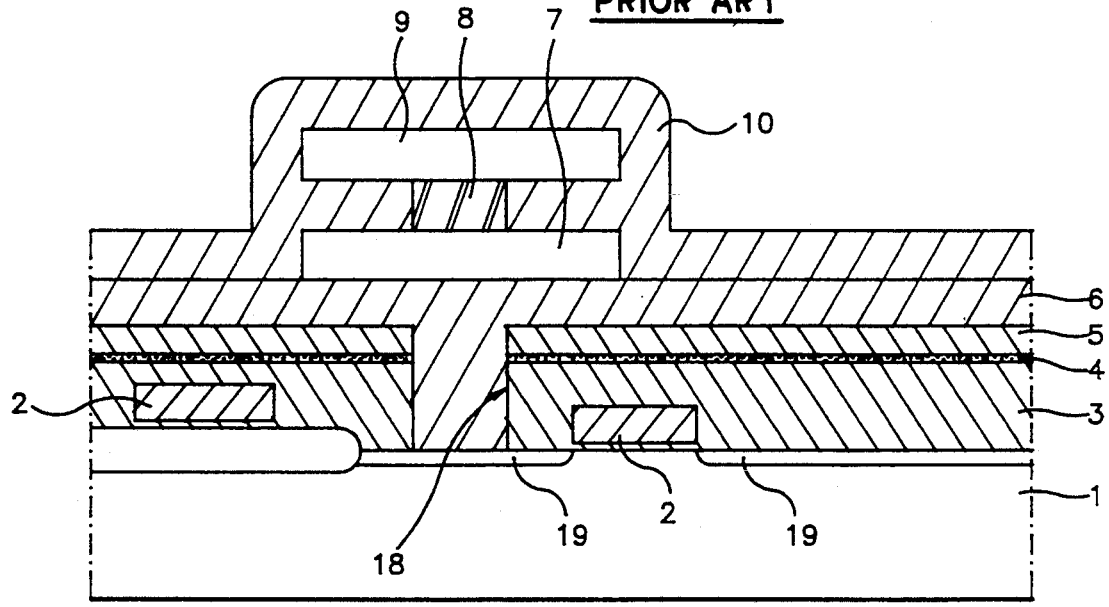
Figure 1F:
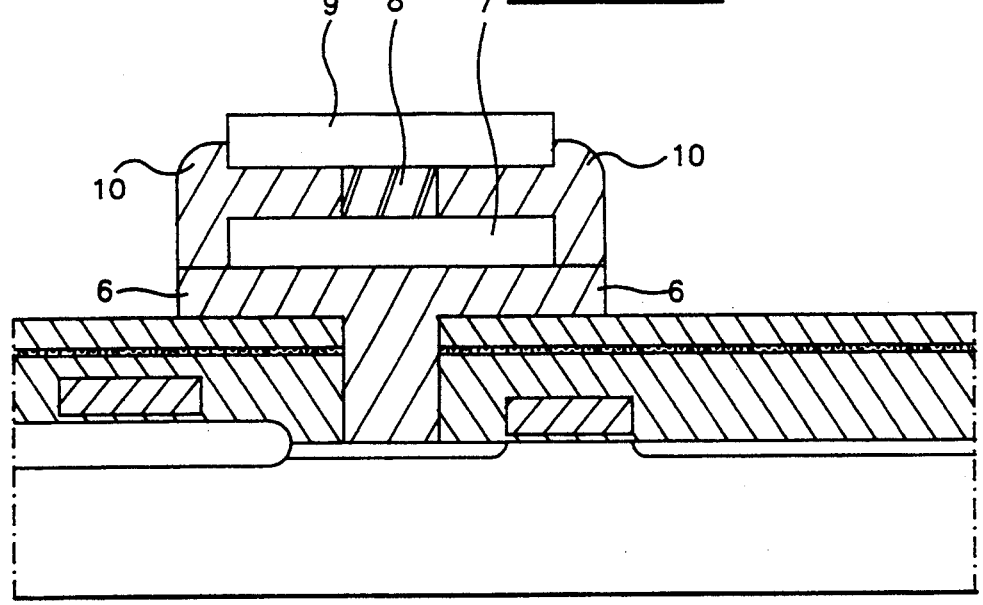
Figure 1G:
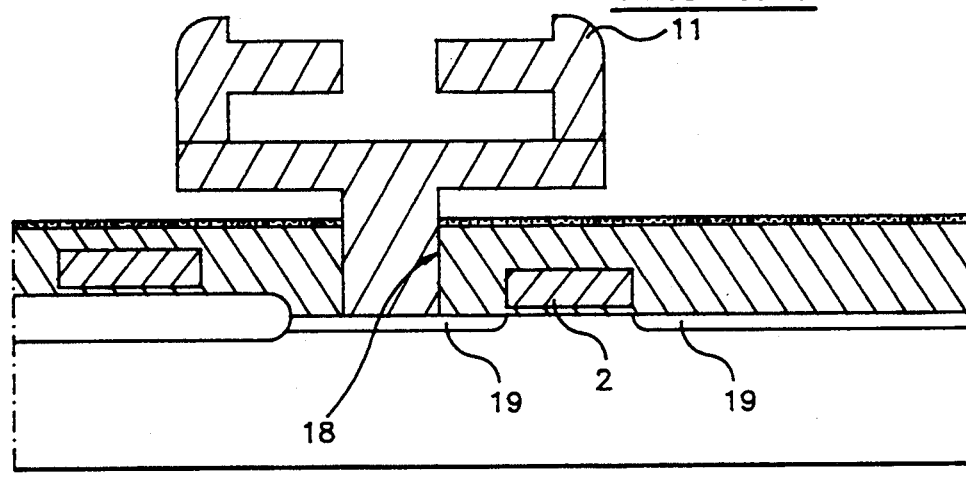
Figure 2A:
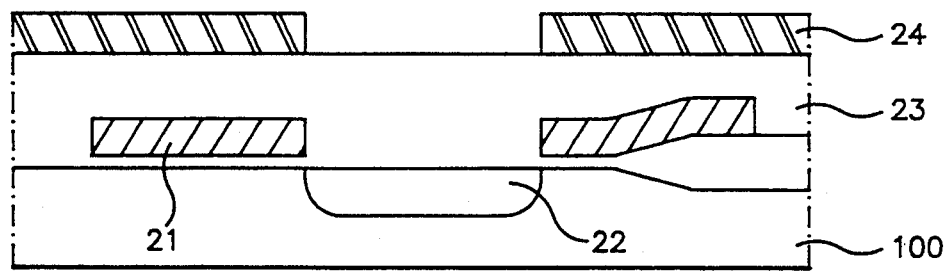
FIGS. 2(a) to 2(k) are processes showing a forming method of a capacitor of a semiconductor memory in accordance with a first embodiment of this invention.

First, as shown in FIG. 2(a), form switching transistors composed of gate pole 21 and source and drain area 22 on a semiconductor substrate 100 having divided into active region and field region. Then, form for example, an oxide film 23 as the first insulation film on all over the surface of above resultant, on which form, for example, 1000 angstroms to 2000 angstroms thick nitride film 24 as the second insulation film which has greater selective etching ratio than the oxide film of the first insulation film using SiH4 gas or NH3 gas with LPCVD(Low Pressure Chemical Vapor Deposition) method or PECVD(Plasma Enhanced Chemical Vapor Deposition) method, and carry out patterning into a desired pattern with photo-etching process thereafter.

Figure 2B:
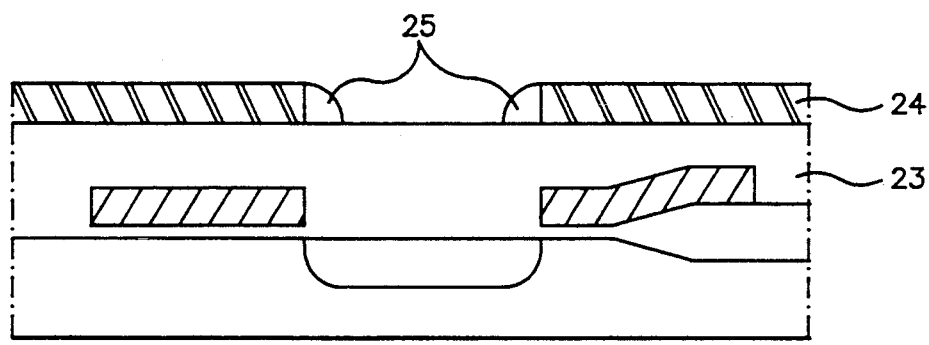

Then, as shown in FIG. 2(b), after forming, for example, silicon or nitride film of 1000 to 2000 angstroms thick as the third insulation film 24 above the oxide film 23 on which the nitride film pattern 24 has been formed, etch back using gases containing Cl or F such as Cl2 or CF4 with anisotropic dry etching to form side wall 25 on the side of the nitride film pattern 24.

Figure 2C:
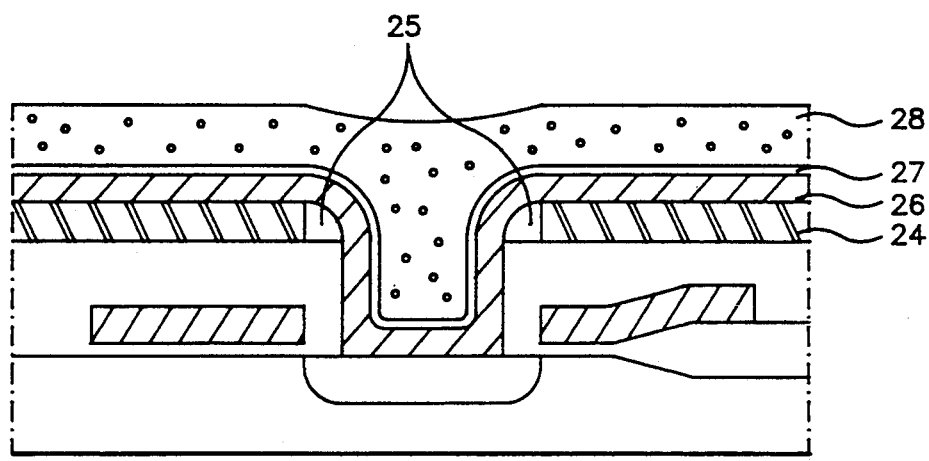

Next, as shown in FIG. 2(c), carry out a selective dry etching of the formed nitride film pattern 24 and the side wall 25 using mask, and the oxide film 23 under the nitride film pattern 24 and the side wall using gases such as CHF3 to form contact hole so as to expose the source (or drain) area 22 of the formed switching transistor. Then form a first conduction layer 26, an etch preventing film 27 and a temporary film successively on all over the surface of above resultant.

In this time, the first conduction layer 26 is a silicon film such as an amorphous silicon film or a poly crystal silicon film formed with LPCVD method using a mixture gas of SiH4 and PH3 etc., at a temperature of 540 degrees C. to 620 degrees C. to a thickness of 500 angstroms to 1500 angstroms, the etch preventing film 27 is an organic insulation film such as polyimide or PIQ or nitride film, having a selective etching property over the silicon film of the first conduction layer 26 in dry etching formed to a thickness of 500 angstrom to 2000 angstroms, and the temporary film 28 is of materials having a selective etching property over the etch preventing film 27 in wet etching, for example an oxide film which is formed to a thickness of 1000 angstroms to 2000 angstroms with LPCVD method or PECVD method using gases such as SiH4 gas or O2 gas.

In this time, because to the first conduction layer 26 is deposited along the side wall 25 of the nitride film pattern 24 having formed above the contact hole, the coating property of the conduction layer at the contact hole can be improved.

Figure 2D:
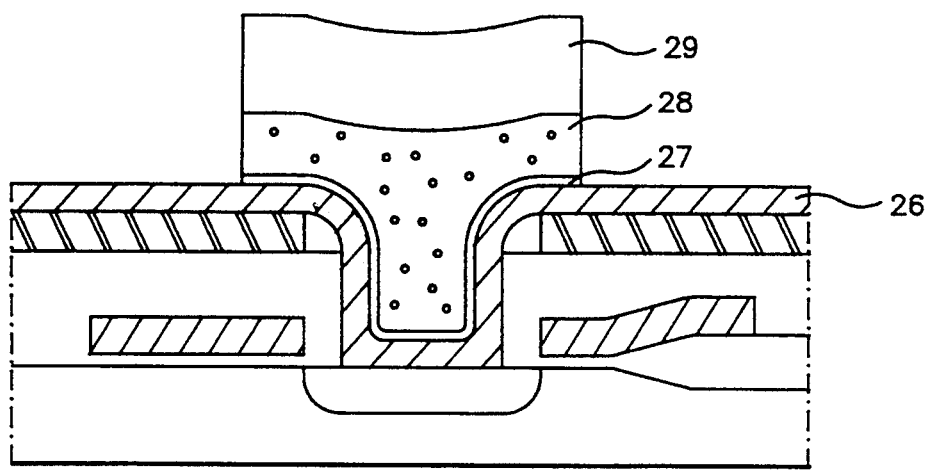

Next, as shown in FIG. 2(d), carry out a selective etching of the temporary film 28 and the etch preventing film 27 with plasma etching method or O2 sputtering etching method etc., using CHF3, CF4 or O2 utilizing the photo resist pattern 29 having formed with a general photo etching process as a mask, to expose the first conduction layer 26.

Figure 2E:
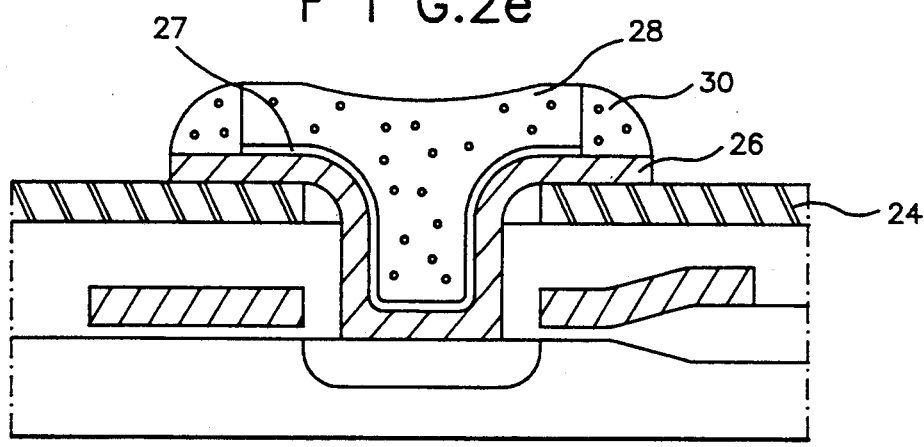

Next, as shown in FIG. 2(e), after removing the photo resist pattern, deposit an oxide film of the same material as the temporary film 28 to a thickness of 1000 angstrom to 2500 angstroms on all over the surface of above resultant, then form a side wall 30 on the side of the temporary film 28 by etching back with anisotropic dry etching. Thereafter carry out patterning of the exposed first conduction layer 26 using the temporary film 23 and the side wall of the temporary film 30 as a mask with a selective etching using gases like Cl2.

At this time, as the width of the first conduction layer is increased as much as the width of the side wall of the temporary film 30, the capacity of the capacitor can be increased as much.

Figure 2F:
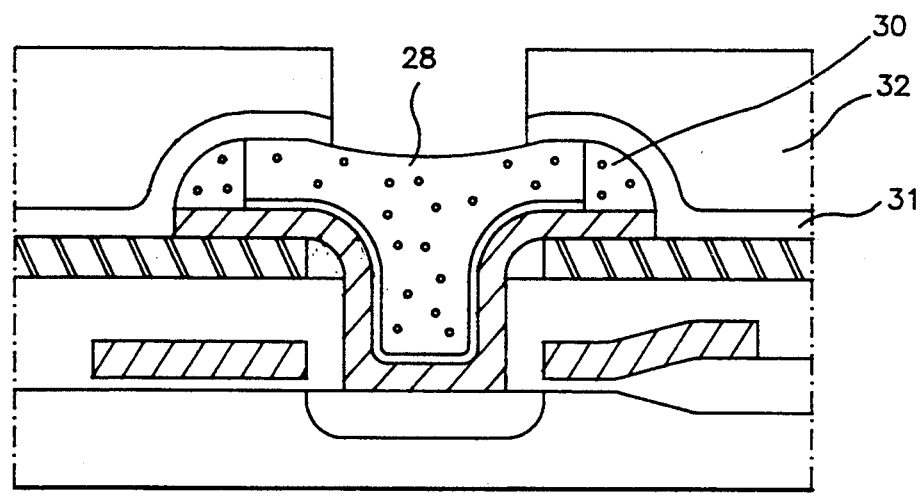

Then, as shown in FIG. 2(f), form an organic insulation film of polyimide and the like or a nitride film having a selective etching property over the oxide film constituting the temporary film 28 and the side wall 30 of the temporary film in wet etching, and over the first conduction film 26 in dry etching, to a thickness of 1000 angstroms to 2000 angstroms on all over the surface of above resultant as a fourth insulation film 31.

And after forming predetermined photo resist pattern 32 on the second insulation film 31 with a general photo etching process, using which as a mask, carry out selective etching of the fourth insulation film 31 to expose the surface of the temporary film 28 selectively.

Figure 2G:
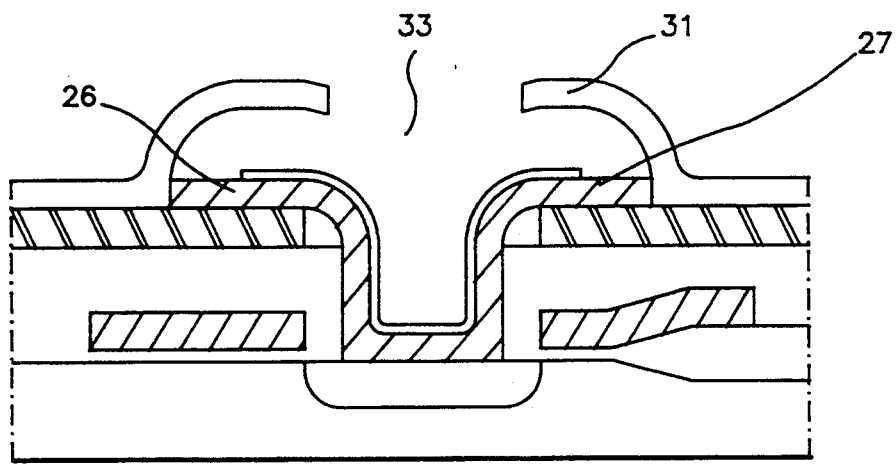

Next, as shown in FIG. 2(g), after removing the photo resist pattern 32 used as a mask as above, remove the temporary film and the side wall of the temporary film with wet etching using water solution containing HF liquid to form an internal space 33.

Figure 2H:
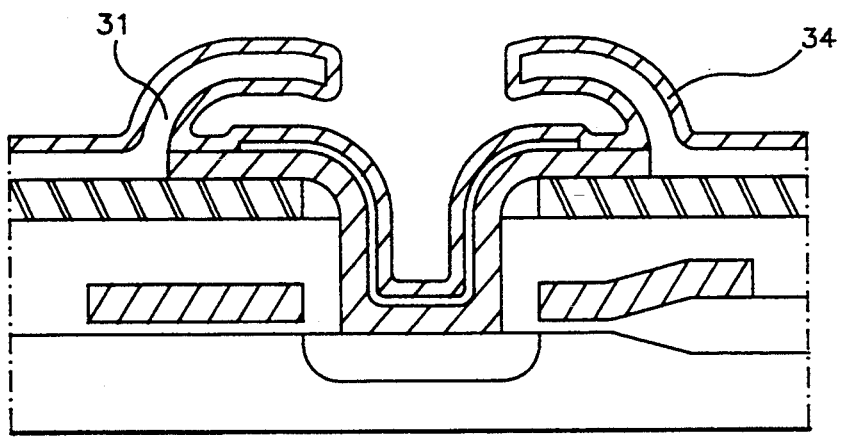

Thereafter, as shown in FIG. 2(h), form a second conduction layer 34 by deposition of a conductive silicon film with LPCVD method at 540 degrees C. to 620 degrees C. to a thickness of 500 angstrom to 1000 angstroms on all over the surface of above resultant. In this time, as the second layer 34 is formed along the slope of the internal space 33, the coating property can be improved and the area of the capacitor pole can be increased.

Figure 2I:
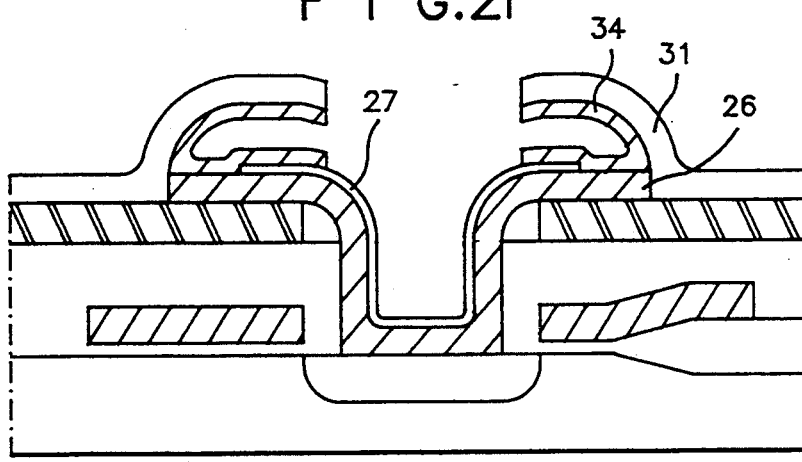

Next, as shown in FIG. 2(i), etch back the second conduction layer 34 so as to leave conductive silicon film only on inside surface of the internal space selectively.

At this time, the etch preventing film 27 serves to prevent the first conduction layer 26 from being etched in the etching process of the second conduction layer 34.

Figure 2J:
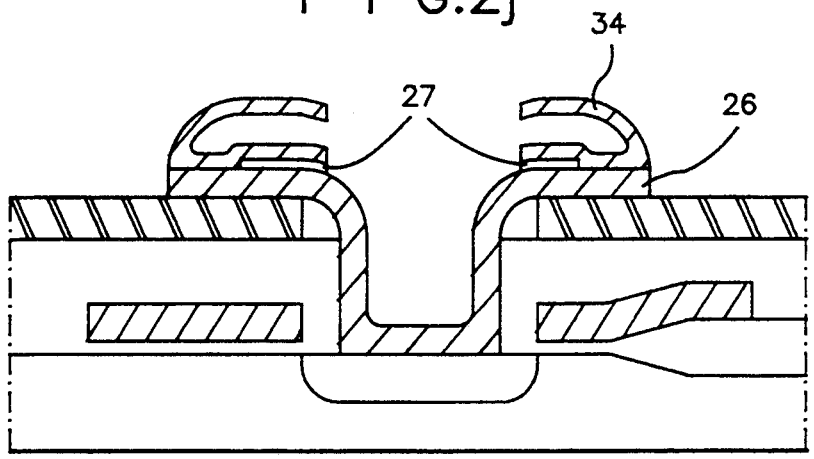

Next, as shown in FIG. 2(j), after selective etching of the etch preventing film 27 using the second conduction layer 34 as a mask to expose the first conduction film 26, remove the fourth insulation film 31 with wet etching.

Figure 2K:
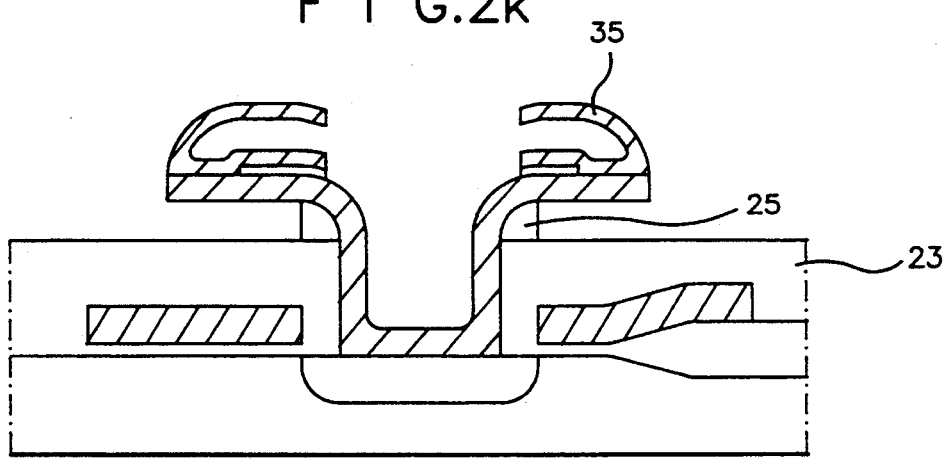

Next, as shown in FIG. 2(k), complete a staked capacitor storage node 35 composed of the first conduction layer 26 and the second conduction layer 34 by removing the first insulation film under the first conduction layer 26 with wet etching.

A capacitor of a semiconductor memory, as shown in FIG. 3, can be obtained by forming a capacitor plate pole 37 by deposition of conductive silicon film with LPCVD method at 540 degrees C. to 620 degrees C. to a thickness of 2000 angstroms after forming, for example a stacked film of a silicon nitride film and an oxide film as a capacitor dielectric film 36 on the surface of the storage node formed in the foregoing method.

Figure 4:
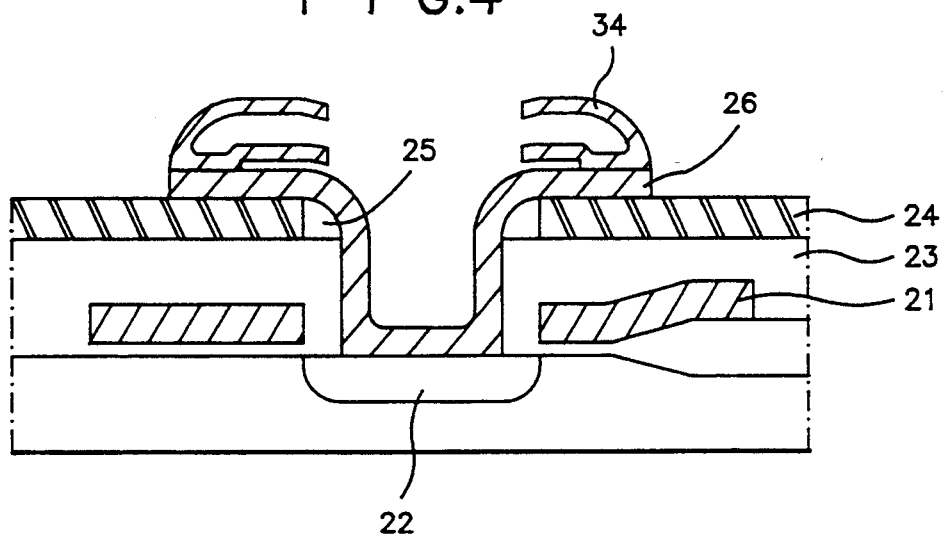
FIG. 4 shows a forming method of a capacitor of a memory in accordance with a second embodiment of this invention.

FIG. 4 shows a second embodiment of this invention, wherein the processes up to FIG. 2(i) can be finished by utilizing the same processes with the processes of the forgoing first embodiment of FIG. 2. Thereafter, remove the etch preventing film 27 completely without leaving any residue with wet etching to increase the surface area of the storage node utilizing the space produced by the removal of the etch preventing film 27. The processes thereafter proceed the same as the FIG. 2(k) and FIG. 3.

Next, FIG. 5 shows a third embodiment of this invention.

Figure 5A:
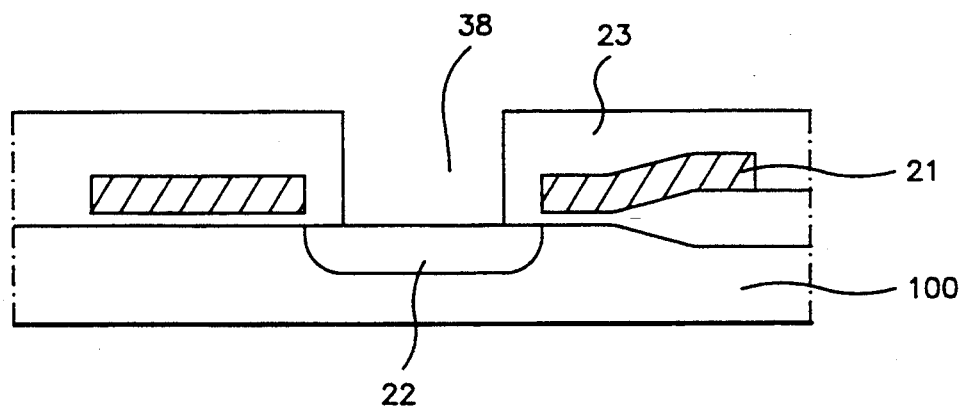
FIGS. 5(a) to 5(e) are processes showing a forming method of a capacitor of a memory in accordance with a third embodiment of this invention.

First, as shown in FIG. 5(a), form a switching transistor composed of gate pole 21 and source and drain area 22 in the active region of a semiconductor substrate 100 divided into an active region and field region. Then, after forming, for example, an oxide film as a first insulation film 23 on all over the surface of above resultant, etch the oxide film selectively to form a contact hole 38 to expose the source(or drain) area 22 of the switching transistor.

Figure 5B:
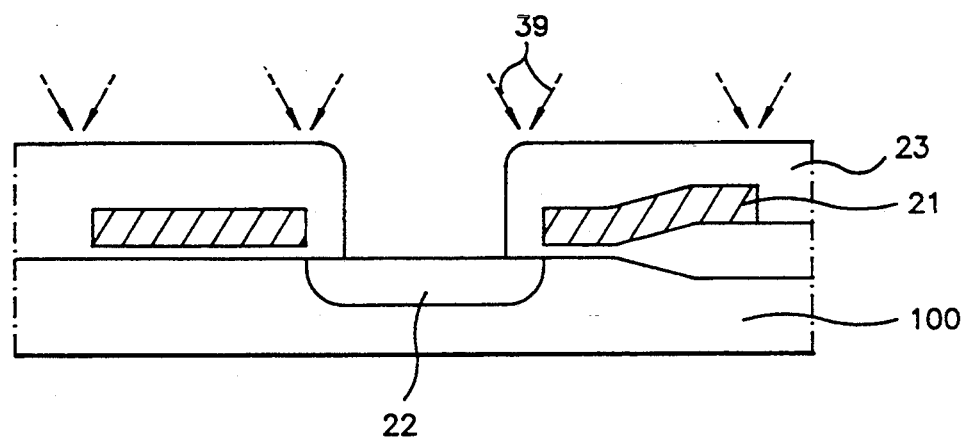

Next, as shown in FIG. 5(b), form rounds on the upper part of the contact hole by sputter etching 39 of the oxide film 23 around the upper part of the contact hole using inert gases like Ar+, which allows to omit the forming processes of the nitride film pattern and the side wall above the first insulation film 23 in the embodiment of FIG. 2, while allowing to form rounds on the upper part of the contact hole resulting to improve the coating property of the first conduction layer.

In this time, as a forming process of the round on the upper part of the contact hole, instead of foregoing Ar+ sputter etching, utilization of isotropic etching with a wet etching using a solution containing HF or an isotropic etching containing F ions is also possible.

Figure 5C:
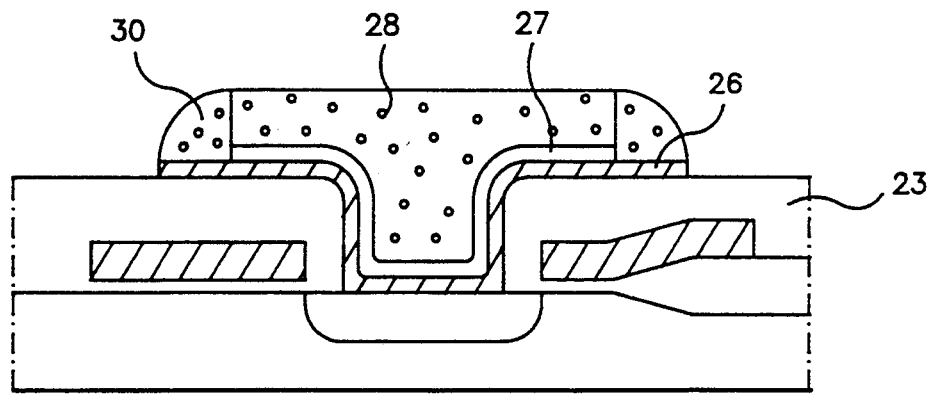

Next, as shown in FIG. 5(c), after forming a first conduction layer 26, an etch preventing film 27 and a temporary film 28 successively on all over the surface of above resultant, carry out a selective etching of the temporary film 28 and the etch preventing film 27 using the photo resist pattern (not shown) having formed by a general photo etching process as a mask, to expose of the first conduction layer 26. Then form side wall 30 on the side of the temporary film 28, utilizing the temporary film 28 and the side walls 30 of the temporary film as a mask, and carry out pattering by an selective etching of the exposed first conduction layer 26. The above first conduction layer 28, etch preventing film 27 and temporary film 28 are formed of the same materials and in the same processes of deposition, and etched to a desired pattern by the same etching method, with those of the first embodiment.

Figure 5D:
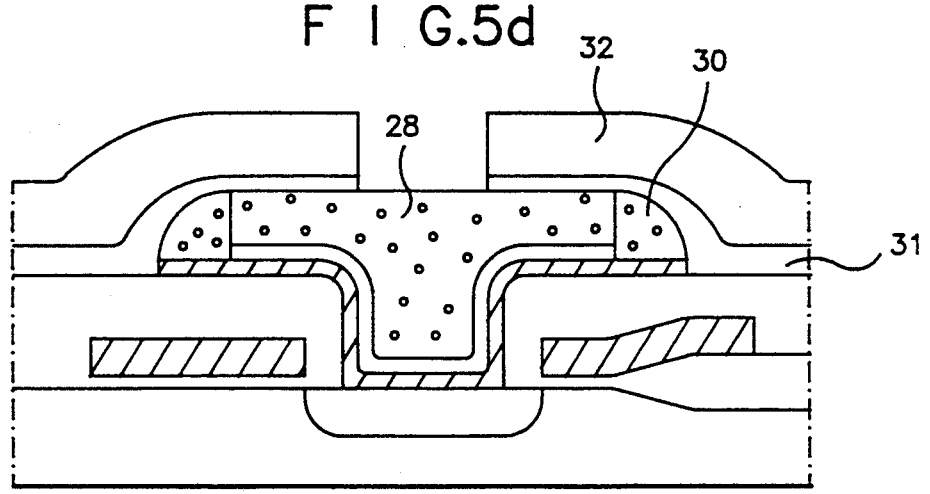

Next, as shown in FIG. 5(d), after forming an insulation film 31 on all over the surface of above resultant, carry out a selective etching of the insulation film 31 using predetermined photo resist pattern 32, to expose the surface of the temporary film 28 selectively.

Figure 5E:
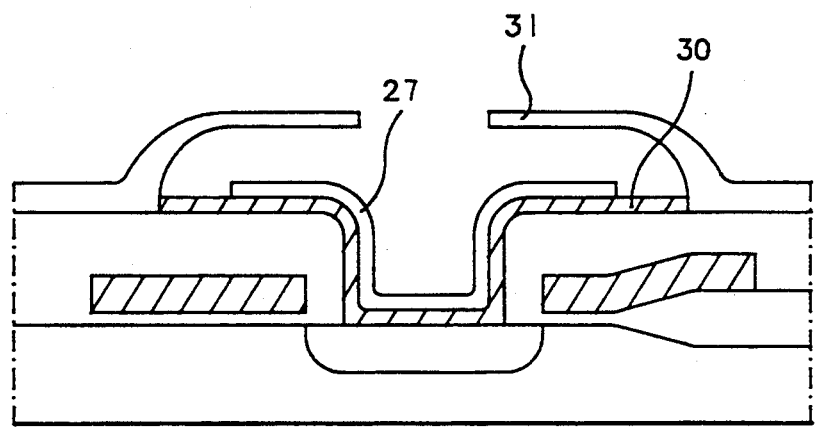

Next, as shown in FIG. 5(e), remove the photo resist pattern 32 used as a mask, and remove the temporary film and the side wall of the temporary film with wet etching using a water solution containing HF solution to form an internal space.

The processes thereafter is omitted because the processes thereafter proceed the same as the processes of the first embodiment of this invention.

Also, because the first conduction layer 26, the etch preventing film, the temporary film and the insulation film 32 are formed of the same materials and in the same deposition methods, and etched to a desired pattern with the same etching method, with those of the first embodiment, the descriptions for those processes will be omitted herein too.

As described hereinbefore in detail, according to this invention, in a stacked capacitor, because the first conduction layer which is the lower conduction layer is formed along the round of the upper part of the contact hole connecting the switching transistor with the capacitor, the coating property can be improved, because the second conduction layer which is the upper conduction layer is formed along the sloped surface of the internal space having formed following the forming and the removal of the temporary film and the side wall of the temporary film, it is possible to obtain the advantages of the coating property improvement as well as of the increase of the area of the capacitor pole due to the increase of the width of the conduction film as much as the width of the side wall of the temporary film, and further increase of the pole area by the space produced through the removal of the etch preventing film which had been formed in the internal space is also possible. Accordingly, in conclusion, increase of a capacitor capacity of a semiconductor memory becomes possible.

In the meantime, relief from the strictness of processes can be obtained because the patterning on the insulation film is carried out in a self-adjusting way without utilizing the upper and the lower conduction film as a photo resist mask.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a semiconductor memory, comprising steps for:
   forming transistors on a semiconductor substrate;
   forming a first insulation film on the semiconductor substrate on which the transistors have been formed;
   forming contact holes having round upper part by etching the first insulation film selectively;
   forming successively a first conductive layer, an etch preventing film and a first temporary film on the substrate and the contact holes;
   etching the first temporary film and the etch preventing film to selectively expose the first conductive layer;
   forming a second temporary film on the first temporary film and the first conductive layer;
   etching the second temporary film to form sidewall spacers of the second temporary film at sidewalls of the first temporary film;
   patterning the first conductive film using the first temporary film and the sidewall spacers as masks;
   forming a second insulation film on the first conductive layer, the sidewall spacers and the first temporary film;
   etching the second insulation film selectively removing the temporary film and the sidewall spacers;
   forming a second conductive film on the second insulation film, the first conductive layer and the etch preventing film; and
   etching the second conductive layer to form a capacitor storage node composed of the first conductive layer and the second conductive layer by removing the second insulation film.

2. A method according to claim 1, wherein the step of forming contact holes includes the steps of:
   forming a first insulation film on the semiconductor substrate; forming a second insulation film on the first insulation film;
   forming a second insulation pattern by selective etching the second insulation film; forming a third insulation film on the first insulation film and the second insulation film pattern;
   etching the third insulation film to form sidewall spacers of the third insulation film at sidewalls of the second insulation film pattern; and
   etching the first insulation film selectively using the second insulation film pattern and the sidewall spacers of the third insulation film as a mask.

3. A method according to claim 2, wherein the second insulation film is formed of material having a greater selective etching ratio against the first insulation film.

4. A method according to claim 1, wherein the etch preventing film is formed of material having etching selectivity in dry etching against the first conduction layer.

5. A method according to claim 4, wherein the etch preventing film is formed of an organic insulation film of poly amide or PIQ, or a nitride film.

6. A method according to claim 1, wherein the first temporary film is formed of material having etching selectivity in wet etching against the etch preventing film.

7. A method according to claim 1, wherein the sidewall spacers of the second temporary film are formed of the same material as the first temporary film.

8. A method according to claim 1, wherein the second insulation film is formed of a material having an etching selectively over the temporary film and the sidewall spacers of the second temporary film in wet etching, while having an etching selectively over the first conductive layer in dry etching.

9. A method according to claim 8, wherein the second insulation film is formed of an organic insulation film of polyamide or a nitride film.

10. A method according to claim 8, wherein the step of forming contact holes includes the steps of:
    forming an insulation film on the semiconductor substrate;
    forming contact holes on predetermined parts by a selective etching of the first insulation film; and
    etching the corner of the upper part of the contact hole by carrying out a sputter etching using inert ions.

11. A method according to claim 1, wherein the step of forming contact holes includes the steps of:
    forming a first insulation film on the semiconductor substrate;
    forming contact holes on parts of the first insulation film; and
    wet etching the first insulation film.

12. A method according to claim 1, wherein the step of forming contact holes includes the steps of:
    forming a first insulation film on the semiconductor substrate on which transistors have been formed;
    forming contact holes on parts by a selective etching of the first insulation film; and
    carrying out an isotropic dry etching of the first insulation film.

13. A method according to claim 1, wherein the first conductive layer is protected by the etch preventing film in said step of etching the second conductive layer.

14. A method according to claim 1, further comprising the step of etching the etch preventing film using the second conductive layer as a mask after said step of etching the second conductive layer.

15. A method according to claim 14, wherein said step of etching the etch preventing film is carried out using a dry etching or a well etching.

16. A method according to claim 1, further comprising the steps of:
 forming capacitor dielectric film on the surface of the capacitor storage node, after said step of etching the second conductive layer, to form the capacitor storage node; and
 forming a capacitor plate pole on the capacitor dielectric film.

17. A method according to claim 1, wherein the first and second temporary films are formed of an insulation film.

* * * * *